(12) United States Patent
Jung et al.

(10) Patent No.: US 11,765,833 B2
(45) Date of Patent: Sep. 19, 2023

(54) SUBSTRATE HAVING ELECTRIC COMPONENT EMBEDDED THEREIN

(71) Applicant: SAMSUNG ELECTRO-MECHANICS CO., LTD., Suwon-si (KR)

(72) Inventors: Myeong Hui Jung, Suwon-si (KR); Seung Eun Lee, Suwon-si (KR); Yong Hoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 14 days.

(21) Appl. No.: 17/681,093

(22) Filed: Feb. 25, 2022

(65) Prior Publication Data
US 2023/0104939 A1  Apr. 6, 2023

(30) Foreign Application Priority Data
Oct. 1, 2021  (KR) .................. 10-2021-0131109

(51) Int. Cl.
*H05K 1/18* (2006.01)

(52) U.S. Cl.
CPC ....... *H05K 1/186* (2013.01); *H05K 2201/096* (2013.01); *H05K 2201/09481* (2013.01); *H05K 2201/09827* (2013.01)

(58) Field of Classification Search
None
See application file for complete search history.

(56) References Cited

U.S. PATENT DOCUMENTS

| 10,748,856 | B2* | 8/2020 | Moon | H01L 23/5383 |
| 2003/0090883 | A1* | 5/2003 | Asahi | H01L 25/16 |
| | | | | 257/E21.705 |
| 2008/0277776 | A1* | 11/2008 | Enomoto | H05K 1/115 |
| | | | | 257/E25.023 |
| 2010/0097770 | A1* | 4/2010 | Park | H01L 24/24 |
| | | | | 216/17 |

FOREIGN PATENT DOCUMENTS

| JP | 2005-109307 A | | 4/2005 |
| JP | 2017-157793 A | | 9/2017 |
| KR | 20120031362 A | * | 4/2012 |

OTHER PUBLICATIONS

KR 20120031362 A (Translation) (Year: 2023).*

* cited by examiner

*Primary Examiner* — Hoa C Nguyen
*Assistant Examiner* — John B Freal
(74) *Attorney, Agent, or Firm* — Morgan, Lewis & Bockius LLP

(57) ABSTRACT

A substrate having an electronic component embedded therein includes first and second insulating layers including first and second cavities, respectively, first and second electronic components disposed within the first and second cavities, respectively, a first adhesive layer disposed between the first and second insulating layers, and a connection member penetrating through at least a portion of the first adhesive layer. One end and the other end of the connection member are connected to the first and second electronic components, respectively.

11 Claims, 7 Drawing Sheets

SUBSTRATE HAVING ELECTRIC COMPONENT EMBEDDED THEREIN

CROSS-REFERENCE TO RELATED APPLICATION(S)

This application claims benefit of priority to Korean Patent Application No. 10-2021-0131109 filed on Oct. 1, 2021 in the Korean Intellectual Property Office, the disclosure of which is incorporated herein by reference in its entirety.

TECHNICAL FIELD

The present disclosure relates to a substrate having an electric component embedded therein.

BACKGROUND

As demand for semiconductors used in cloud computing, artificial intelligence, electric vehicles, and high-speed communications has rapidly increased, demand for printed circuit boards (PCBs) has also increased to support the growing demand. Technology for making a printed circuit board larger and embedding and packaging a plurality of high-performance semiconductors together is required, and accordingly, an overall size of a substrate may be increased.

An existing embedded passive substrate (EPS) technology is a structure in which passive components are embedded in a PCB. The number of passive components increases in line with high capacity, and here, a size of the board may be reduced only if as many as passive components are built in the board as possible. Thus, a size of the board may be reduced and the efficiency may be maximized. Therefore, development of EPS technology of embedding passive components in multiple layers in a vertical direction is proposed.

SUMMARY

Exemplary embodiments provide a substrate having an electronic component embedded therein, which is advantageous for thinning.

Exemplary embodiments provide a substrate having an electronic component embedded therein, which is advantageous for a reduction of a size thereof.

Exemplary embodiments provide a substrate having an electronic component embedded therein, increasing signal transmission efficiency by shortening a connection distance between a plurality of passive components.

Exemplary embodiments provide a substrate having an electronic component embedded therein, simplifying a process through batch stacking and reducing manufacturing costs.

According to an aspect of the present disclosure, a substrate having an electronic component embedded therein includes: first and second insulating layers including first and second cavities, respectively; first and second electronic components disposed within the first and second cavities, respectively; a first adhesive layer disposed between the first and second insulating layers; and a connection member penetrating through at least a portion of the first adhesive layer. One end and the other end of the connection member are connected to the first and second electronic components, respectively.

According to an aspect of the present disclosure, a substrate having an electronic component embedded therein includes: first and second insulating layers including first and second cavities, respectively; first and second electronic components disposed within the first and second cavities, respectively; a first adhesive layer disposed between the first and second insulating layers; an insulator disposed on the first and second insulating layers and disposed in at least a portion of the first and second cavities; and a connection member penetrating through at least a portion of the first adhesive layer. One surface of the first adhesive layer is in contact with the first electronic component and the other surface of the first adhesive layer is in contact with the second electronic component.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
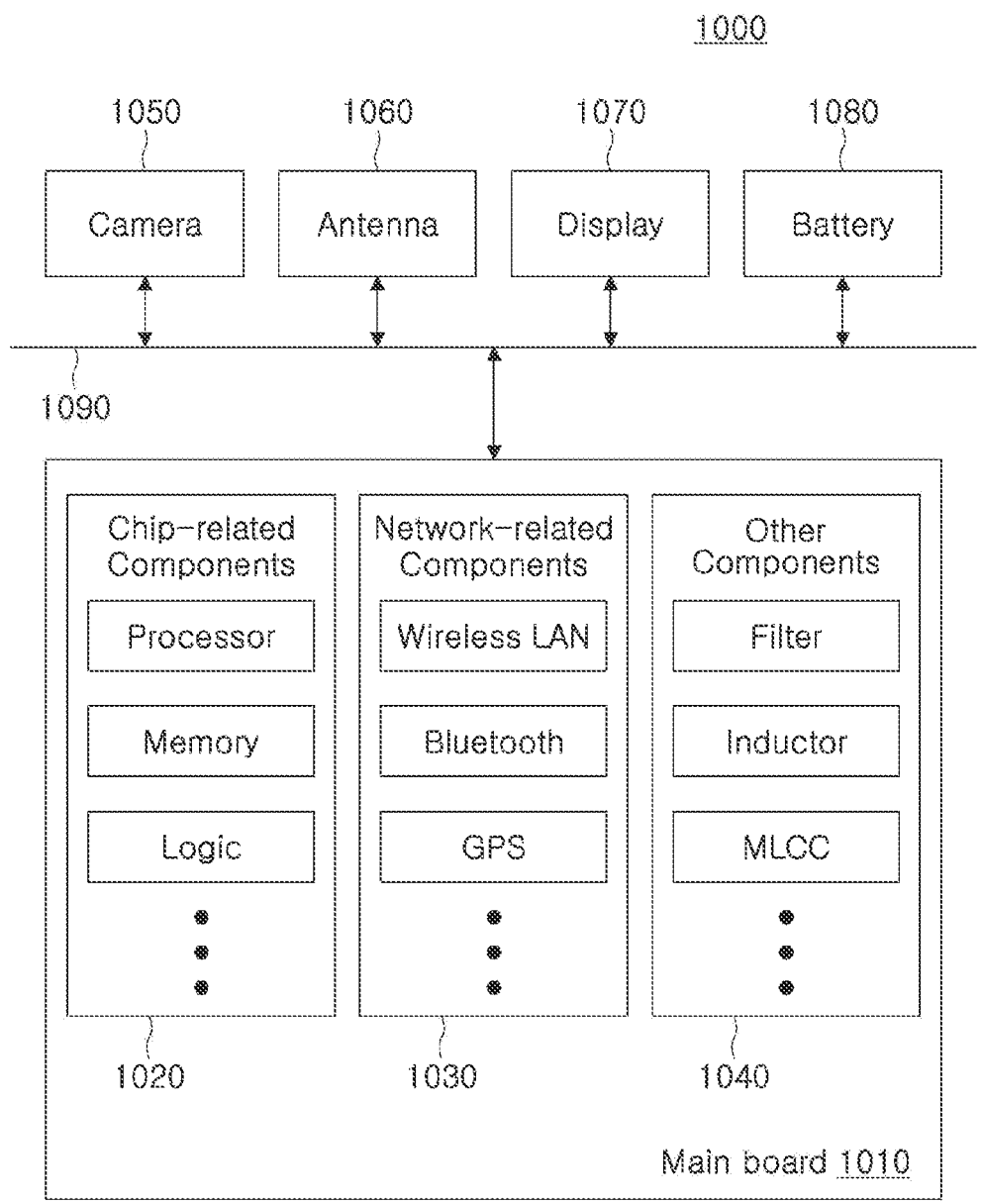
FIG. 1 is a block diagram schematically illustrating an example of an electronic device system.

Hereinafter, the present disclosure will be described with reference to the accompanying drawings. The shapes and sizes of elements in the drawings may be exaggerated or reduced for clearer description.

FIG. 1 is a schematic block diagram illustrating an example of an electronic device system Referring to FIG. 1, an electronic device 1000 may accommodate a main board 1010 therein. The main board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (e.g., a dynamic random access memory (DRAM)), a non-volatile memory (e.g., a read only memory (ROM)), a flash memory, or the like; an application processor chip such as a central processor (e.g., a central processing unit (CPU)), a graphics processor (e.g., a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, but may also include other types of chip related components. In addition, the chip-related components 1020 may be combined with each other. The chip-related components 1020 may be in the form of a package including the chip or described above.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network-related components 1030 are not limited thereto, but may also include a variety of other wireless or wired standards or protocols. In addition, the network-related components 1030 may be combined with the chip-related components 1020 so as to be provided in the form of a package.

Other components 1040 may include a high-frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with the chip-related components 1020 and/or the network-related components 1030 so as to be provided in the form of a package.

Depending on a type of the electronic device 1000, the electronic device 1000 may include other components that may or may not be physically or electrically connected to the main board 1010. These other components may include, e.g., a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (e.g., a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
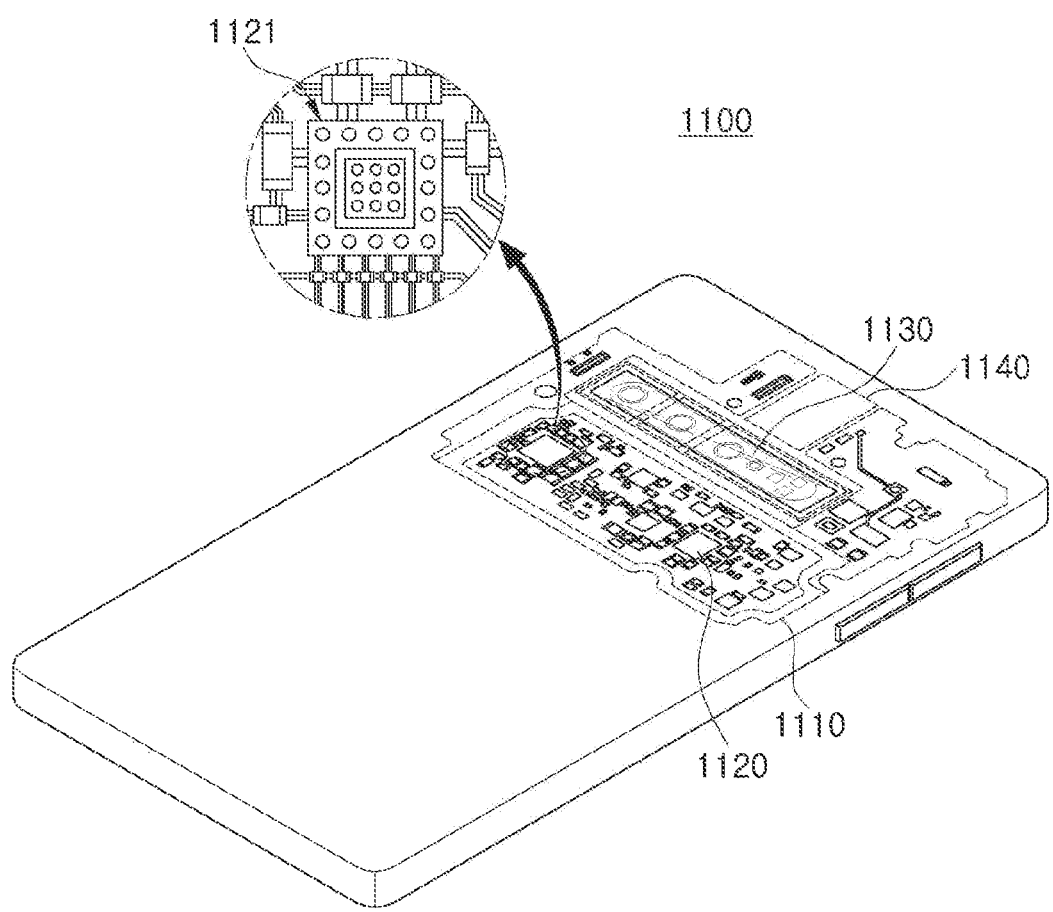
FIG. 2 is a perspective view schematically illustrating an example of an electronic device.

FIG. 2 is a schematic perspective view illustrating an example of an electronic device.

Referring to FIG. 2, an electronic device may be, e.g., a smartphone 1100. The smartphone 1100 may accommodate a mother board 1110 therein, and various electronic components 1120 may be electrically and/or physically connected to the mother board 1110. In addition, a camera module 1130 and/or a speaker 1140 may be accommodated in the mother board 1110. Some of the electronic components 1120 may be the chip-related components, e.g., a substrate having an electronic component embedded therein, but is not limited thereto. The electronic device is not necessarily limited to the smartphone 1100, but may be other electronic devices as described above.

Figure 3:
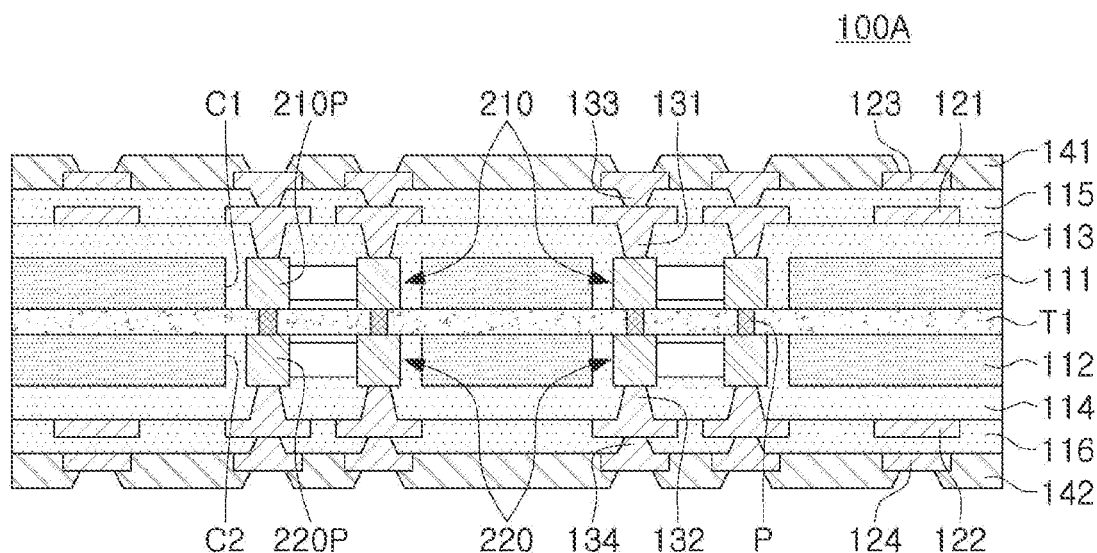
FIG. 3 is a cross-sectional view schematically illustrating an example of a substrate having an electronic component embedded therein.

FIG. 3 is a cross-sectional view schematically illustrating an example of a substrate having an electronic component embedded therein.

Referring to FIG. 3, a substrate 100A having an electronic component embedded therein according to an example includes a first insulating layer 111 having a first cavity C1, a second insulating layer 112 having a second cavity C2, a first adhesive layer T1 disposed between the first and second insulating layers 111 and 112 and having a through portion, a connection member P disposed in the through portion, first and second electronic components 210 and 220 disposed in the second cavities C1 and C2, respectively, a third insulating layer 113 filling at least a portion of the first cavity C1 and covering the first electronic component 210, a fourth insulating layer 114 filling at least a portion of the second cavity C2 and covering the second electronic component 220, first and second interconnection layers 121 and 122 respectively disposed on the third and fourth insulating layers 113 and 114, a first via layer 131 connecting the first interconnection layer 121 to the first electronic component 210, and a second via layer 132 connecting the second interconnection layer 122 to the second electronic component 220.

For example, the substrate 100A having an electronic component embedded therein according to an example may be manufactured by collectively stacking the first and second insulating layers 111 and 112 having the first and second cavities C1 and C2 on one surface and the other surface of the first adhesive layer T1 in which the connection member P is disposed, as in a process described below. Here, the first and second electronic components 210 and 220 may be disposed in the first and second cavities C1 and C2, respectively. In this case, since a plurality of electronic components may be vertically arranged to overlap each other when viewed in a thickness direction of the substrate, and thus, the substrate 100A having an electronic component embedded therein advantageous for minimizing a signal transmission distance between the electronic components 210 and 220 may be provided.

Meanwhile, in the substrate 100A having an electronic component embedded therein according to an example, the plurality of electronic components 210 and 220 may be embedded, thus reducing an overall size of the substrate, and a central axis between upper and lower portions of the substrate may be close to the electronic components 210 and 220, thereby increasing proportions of areas of the electronic components 210 and 220 in the substrate, which may be advantageous in improving warpage.

Meanwhile, the substrate 100A having an electronic component embedded therein according to an example has a structure in which the first and second electronic components 210 and 220 are electrically connected through the connection member P disposed in the first adhesive layer T1. The first and second electronic components 210 and 220 are connected to and in contact with one end and the other end of the connection member P, and in this case, the first and second electronic components 210 and 220 may be connected by the shortest distance through the connection member P, thereby shortening a signal transmission time and preventing an occurrence of signal failure. That is, one end of the connection member P may contact the first electronic component 210, and the other end of the connection member P may contact the second electronic component 220.

Meanwhile, in the substrate 100A having an electronic component embedded therein according to an example, as a result of a process to be described below, respective vias of the first and third via layers 131 and 133, among a plurality of via layers 131, 132, 133, and 134, may have a shape tapered in a direction opposite to that of vias of the second and fourth via layers 132 and 134, among the plurality of via layers 131, 132, 133, and 134. Specifically, the first via layer 131 may be connected to and in contact with the first electronic component 210, and the second via layer 132 may be connected to and in contact with the second electronic component 220. That is, one end of an electrode 210P of the first electronic component 210 may be connected to the connection member P, and the other end of the electrode 210P may be connected to the first via layer 131. Similarly, one end of an electrode 220P of the second electronic component 220 may be connected to the connection member P, and the other end of the electrode 220P may be connected to the second via layer 132.

Meanwhile, the substrate 100A having an electronic component embedded therein according to an example may include the first adhesive layer T1 disposed between the first and second insulating layers 111 and 112. The first adhesive layer T1 may include a material different from that of the first and second insulating layers 111 and 112, and may include, e.g., a bonding sheet. Thereby, bonding between the first and second insulating layers 111 and 112 accommodating the first and second electronic components 210 and 220, respectively, may be more effectively promoted.

Meanwhile, the substrate 100A having an electronic component embedded therein according to an example may further include fifth and sixth insulating layers 115 and 116 respectively disposed on one surfaces of the third and fourth insulating layers 113 and 114, third and fourth interconnection layers 123 and 124 respectively disposed on the fifth and sixth insulating layers, a third via layer 133 penetrating through the fifth insulating layer 115 and connecting the third interconnection layer 123 to the first interconnection layer 121, a fourth via layer 134 penetrating through the sixth insulating layer 116 and connecting the fourth interconnection layer 124 to the second interconnection layer 122, a first passivation layer 141 having a plurality of first openings exposing at least a portion of the third interconnection layer 123, and a second passivation layer 142 having a plurality of second openings exposing at least a portion of the fourth interconnection layer 124. Through these elements, internal components may be protected from physical or chemical damage.

Hereinafter, the components of the substrate 100A having an electronic component embedded therein according to an example are described in more detail with reference to the accompanying drawings.

The plurality of insulating layers 111, 112, 113, 114, 115, and 116 may include first to sixth insulating layers 111, 112, 113, 114, 115, and 116.

The first and second insulating layers 111 and 112 may function as core layers. The first and second insulating layers 111 and 112 may further improve rigidity of the substrate 100A having an electronic component embedded therein according to specific materials. The first insulating layer 111 has the first cavity C1 penetrating therethrough, and the second insulating layer 112 has the second cavity C2 penetrating therethrough. The first and second cavities C1 and C2 may be closed spaces with all four sides closed or may have a discontinuous portion, e.g., an externally open portion, in a partial region thereof if necessary. If necessary, a plurality of each of the first and second cavities C1 and C2 may be provided, and the same or different first and second electronic components 210 and 220 may be disposed therein. A thickness of the first and second insulating layers 111 and 112 may be greater than a thickness of each of the other insulating layers 113, 114, 115, and 116. An insulating material may be used as a material of the first and second insulating layers 111 and 112, and a thermosetting resin such as an epoxy resin or a thermoplastic resin such as polyimide may be used as the insulating material. In addition, an inorganic filler such as silica, etc. and a reinforcing material such as glass fiber, etc. may be included in these resins so as to be used. For example, a prepreg may be used, but is not limited thereto.

The first and second electronic components 210 and 220 may be disposed in the first and second cavities C1 and C2, respectively. The first and second electronic components 210 and 220 may be an integrated circuit (IC) die in which hundreds to millions of devices are integrated in one chip. For example, the first and second electronic components 210 and 220 may be a processor chip such as a central processor (e.g., CPU), a graphics processor (e.g., GPU), a field programmable gate array (FPGA), a digital signal processor, an encryption processor, a microprocessor, or a microcontroller, specifically, an application processor (AP), but is not limited thereto and may be other volatile memories (e.g., DRAM) and non-volatile memories (e.g., ROM), a memory such as a flash memory, an analog-to-digital converter, or logic such as an application-specific IC (ASIC). If necessary, the first and second electronic components 210 and 220 may be chip-type passive components, e.g., chip-type inductors or chip-type capacitors. The first and second electronic components 210 and 220 may include electrodes 210P and 220P, respectively. The electrodes 210P and 220P of the first and second electronic components 210 and 220 may include a metal material such as copper (Cu) or aluminum (Al) and may be connected to the connection member P and the first and second via layers 131 and 132. The first and second electronic components 210 and 220 may be disposed in the first and second cavities C1 and C2 without a separate adhesive film and may be covered by third and fourth insulating layers 113 and 114 to be described below.

Meanwhile, in the present disclosure, the first and second electronic components 210 and 220 may be disposed in positions overlapping each other when viewed in a stacking direction or a thickness direction of the substrate. In the present disclosure, since the first and second cavities C1 and C2 of the first and second insulating layers 111 and 112 are formed in positions overlapping each other in the stacking direction, the first and second electronic components 210 and 220 may also at least partially overlap each other in the stacking direction. Since the first and second electronic components 210 and 220 are disposed such that at least portions thereof overlap each other in the stacking direction or the thickness direction, a distance between the first and second electronic components 210 and 220 may be maintained to be short, and accordingly, a signal transmission distance may be shortened to prevent signal failure and increase a signal transmission speed.

As shown in FIG. 3, the first and second electronic components 210 and 220 may overlap in the thickness direction, having a multi-stage structure. Thereby, it is possible to effectively reduce a size of the substrate 100A having an electronic component embedded therein compared to the number of passive components therein. In addition, since the first and second electronic components 210 and 220 are electrically connected at the shortest distance, a signal transmission distance may be reduced.

That is, one end of the connection member P may contact the first electronic component 210, and the other end of the connection member P may contact the second electronic component 220.

Meanwhile, as shown in FIG. 3, the first and second electronic components 210 and 220 may be disposed on one surface and the other surface of the first adhesive layer T1. That is, the first adhesive layer T1 may contact the first electronic component 210, and the other surface of the first adhesive layer T1 may contact the second electronic component 220. For example, a portion of a region of the electrode 210P of the first electronic component 210 excluding a region in contact with one end of the connection member P may contact one surface of the first adhesive layer T1, and a portion of a region of the electrode 220P of the second electronic component 220 excluding a region in contact with the other end of the connection member P may contact the other surface of the first adhesive layer T1.

The first adhesive layer T1 is disposed between the first and second insulating layers 111 and 112 to increase adhesion between the first and second insulating layers 111 and 112. Any material used as a general adhesive may be used as the first adhesive layer T1 without limitations. For example, the first adhesive layer T1 may include a bonding sheet, an epoxy-based thermosetting resin, or a thermosetting resin such as a prepreg. That is, the first adhesive layer T1 may be formed of an insulating material different from the first and second insulating layers 111 and 112 and may include a material having adhesion higher than that of the first and second insulating layers 111 and 112. Meanwhile, the first adhesive layer T1 may be thinner than the first and second insulating layers 111 and 112.

A through portion may be formed in the first adhesive layer T1. The through portion may be formed in a position corresponding to the electrodes of the first and second electronic components 210 and 220 later when viewed in the thickness direction. Meanwhile, the connection member P may be disposed in the through portion by a paste or a known plating method. For example, the connection member P may include a conductive paste or a metal layer formed by plating. A cross-sectional area of one surface and the other surface of the connection member P may be substantially the same, but is not limited thereto.

A metal material may be used as a material of the connection member P, and the metal material may include copper (Cu), aluminum (Al), silver (Ag), tin (Sn), gold (Au), nickel (Ni), lead (Pb), titanium (Ti), or alloys thereof. In addition, as a material of the connection member P, a conductive paste containing a conductive filler in a resin may be used.

One end of the connection member P may be connected to the first electronic component 210, and the other end of the connection member P may be connected to the second electronic component 220. That is, the connection member P may electrically connect the first and second electronic components 210 and 220, and specifically, one end of the connection member P may be in contact with and connected to the electrode 210P of the first electronic component 210 and the other end of the connection member P may be in contact with and connected to the connecting pad 220P of the second electronic component 220.

The third insulating layer 113 may be disposed on one surface of the first insulating layer 111 to fill at least a portion of the first cavity C1 and cover at least a portion of the first electronic component 210. In addition, the fourth insulating layer 114 may be disposed on one surface of the second insulating layer 112 to fill at least a portion of the second cavity C2 and cover at least a portion of the second electronic component 220. For example, the third insulating layer 113 may physically contact at least a portion of each of an upper surface, a lower surface, and a side surface of the first electronic component 210. In addition, the fourth insulating layer 114 may physically contact at least a portion of each of an upper surface, a lower surface, and a side surface of the second electronic component 220. The fifth insulating layer 115 may be disposed on one surface of the third insulating layer 113, and the sixth insulating layer 116 may be disposed on one surface of the fourth insulating layer 114. Meanwhile, referring to FIG. 3, only the first to sixth insulating layers 111, 112, 113, 114, 115, and 116 are illustrated, but the number of insulating layers may be greater or fewer than those illustrated as needed.

An insulating material may be used as a material of the third to fifth insulating layers 113, 114, 115, and 116, and a thermosetting resin such as an epoxy resin or a thermoplastic resin such as polyimide may be used as the insulating material. In addition, an inorganic filler such as silica may be included in these resin so as to be used. For example, a prepreg may be used as a material of the third to fifth insulating layers 113, 114, 115, and 116, but is not limited thereto, and a material without a reinforcing material such as glass fiber, e.g., Ajinomoto build-up film (ABF), may be used. ABF may be provided in the form of resin coated copper (RCC), but is not limited thereto. If necessary, a photosensitive material such as photo imageable dielectric (PIE) may be used.

As an example, the third to fifth insulating layers 113, 114, 115, and 116 may include a material different from that of the first adhesive layer T1.

The plurality of interconnection layers 121, 122, 123, and 124 may include the first interconnection layer disposed on one surface of the third insulating layer 113, the second interconnection layer 122 disposed on one surface of the fourth insulating layer 114, the third interconnection layer 123 disposed on one surface of the fifth insulating layer 115, and the fourth interconnection layer 124 disposed on one surface of the sixth insulating layer 116. For example, the first interconnection layer 121 may be disposed on an upper surface of the third insulating layer 113, and the second interconnection layer 122 may be disposed on a lower surface of the fourth insulating layer 114. Meanwhile, referring to FIG. 3, only the first to fourth interconnection layers 121, 122, 123, and 124 are illustrated, but the number of interconnection layers may be greater or fewer than those illustrated as needed.

A metal material may be used as a material of the first and second interconnection layers 121 and 122, and the metal material may include copper (Cu), aluminum (Al), silver (Ag), tin (Sn), gold (Au), nickel (Ni), lead (Pb), titanium (Ti), or alloys thereof may be used. The first and second interconnection layers 121 and 122 may perform various functions according to a design. For example, it may include a ground pattern, a power pattern, a signal pattern, and the like. Each of these patterns may have a line, plane, or pad shape. The first and second interconnection layers 121 and 122 may be formed by plating processes such as an additive process (AP), a semi AP (SAP), a modified SAP (MSAP), tenting (TT), and resultantly include a seed layer, which is an electroless plating layer, and an electrolytic plating layer formed based on the seed layer. When the third and fourth insulating layers 113 and 114 are provided in the form of RCC, the first and second interconnection layers 121 and 122 may further include metal foil such as copper foil, and if necessary, a primer resin may be present on a surface of the metal foil.

The plurality of via layers 131, 132, 133, and 134 may include the first via layer 131 penetrating through the third insulating layer 113 and connecting the first interconnection layer 121 to the first electronic component 210, the second via layer 132 penetrating through the fourth insulating layer 114 and connecting the second interconnection layer 122 to the second electronic component 220, the third via layer 133 penetrating through the fifth insulating layer 115 and connecting the third interconnection layer 123 to the first interconnection layer 121, and the fourth via layer 134 penetrating through the sixth insulating layer 116 and connecting the fourth interconnection layer 124 to the second interconnection layer 122.

A metal material may be used as a material of the plurality of via layers 131, 132, 133, and 134, and as the metal material, copper (Cu), aluminum (Al), silver (Ag), tin (Sn), gold (Au), nickel (Ni), lead (Pb), titanium (Ti), or alloys thereof may be used. The plurality of via layers 131, 132, 133, and 134 may include signal vias, ground vias, power vias, and the like according to a design. Vias of the plurality of via layers 131, 132, 133, and 134 may be formed by completely filling respective via holes with a metal material, or a metal material may be formed along a wall surface of a via hole to form each via. The plurality of via layers 131, 132, 133, and 134 may also be formed by a plating process, e.g., AP, SAP, MSAP, TT, or the like and may include a seed layer, which is an electroless plating layer, and an electrolytic plating layer formed based on the seed layer.

Each of the vias of the first to fourth via layers 131, 132, 133, and 134 may have a tapered shape in which a cross-sectional area of one surface thereof is greater than a cross-sectional area of the other surface. Also, the first and third via layers 131 and 133 may be tapered in the same direction, and the second and fourth via layers 132 and 134 may be tapered in a direction opposite to that of the first and third via layers 131 and 133. For example, the first and second via layers 131 and 132 may have shapes that are tapered in opposite directions, and the third and fourth via layers 133 and 134 may also have shapes that are tapered in opposite directions.

Meanwhile, referring to FIG. 3, the first to fourth via layers 131, 132, 133, and 134 are illustrated, but the number of via layers may be greater or fewer depending on the number of insulating layers.

Meanwhile, the connection member P and the plurality of via layers 131, 132, 133, and 134 may have different shapes. Referring to the cross-sectional view of FIG. 3, an inclination of the sidewalls of the plurality of via layers 131, 132, 133 and 134 with respect to a stacking direction on the cross-section may be greater than an inclination of a sidewall of the connection member P on the cross-section with respect to the stacking direction. In this case, the plurality of via layers 131, 132, 133, and 134 have a tapered shape in which a width of one surface thereof is greater than a width of the other surface, and the connection member P may have a shape in which a width of one surface thereof is substantially equal to a width of the other surface thereof. In the present disclosure, the meaning of being substantially the same may be interpreted as including an error occurring during a process.

The first and second passivation layers 141 and 142 may protect internal components from external physical and chemical damage. The first and second passivation layers 141 and 142 may each have a plurality of first and second openings. Each of the plurality of first openings may expose at least a portion of the third interconnection layer 123. Each of the plurality of second openings may expose at least a portion of the fourth interconnection layer 124. Meanwhile, when the interconnection layers has more or fewer layers, the first and second openings may expose at least a portion of the interconnection layers disposed on the facing outermost layers of the substrate 100A having an electronic component embedded therein. An insulating material may be used as a material of the first and second passivation layers 141 and 142. In this case, as the insulating material, a thermosetting resin such as an epoxy resin, a thermoplastic resin such as polyimide, or a mixture of these resins with an inorganic filler, e.g., ABF, but is not limited thereto.

FIGS. 4 to 12 are cross-sectional views schematically illustrating an example of manufacturing a substrate having an electronic component embedded therein of FIG. 3.

Figure 4:
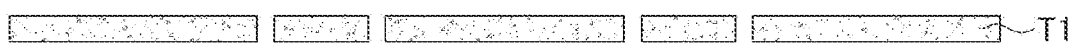
FIGS. 4 to 12 are cross-sectional views schematically illustrating an example of manufacturing a substrate having an electronic component embedded therein of FIG. 3.

Referring to FIG. 4, the first adhesive layer T1 may be prepared first, and the through portion penetrating through at least a portion of the first adhesive layer T1 may be formed through a laser or mechanical drilling process.

Figure 5:
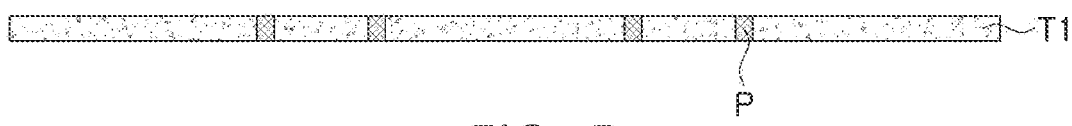

Referring to FIG. 5, the connection member P may be disposed in the through portion of the first adhesive layer T1 through a plating or paste process.

Figure 6:
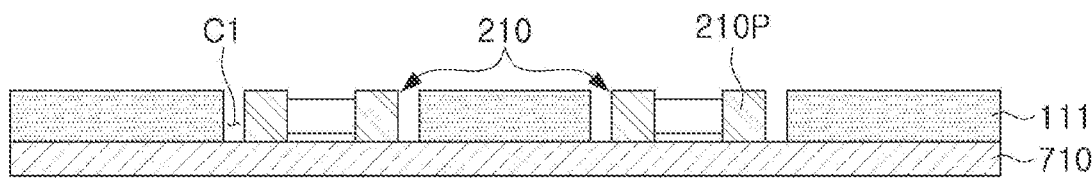

Referring to FIG. 6, the first insulating layer 111 may be disposed on a first carrier 710, the first cavity C1 is formed in the first insulating layer 111 through a laser or mechanical drilling process, and thereafter, the first electronic component 210 may be disposed in the first cavity C1.

Figure 7:
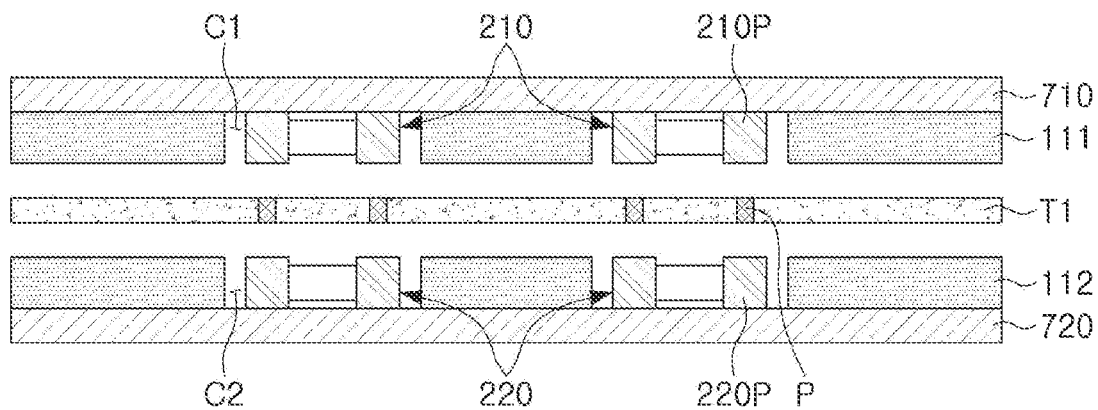

Referring to FIG. 7, the second insulating layer 112 may be disposed on a second carrier 720, and the second electronic component 220 may be disposed in the second cavity C2 formed in the second insulating layer 111. Thereafter, the first insulating layer 111, the first adhesive layer T1, and the second insulating layer 112 may be disposed in this order, and then a batch stacking process may be performed. As a result, the first and second insulating layers 111 and 112 may be bonded using the first adhesive layer T1.

Figure 8:
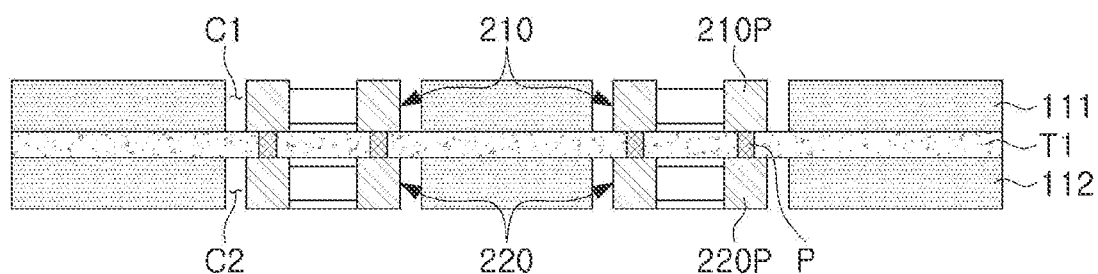
Figure 9:
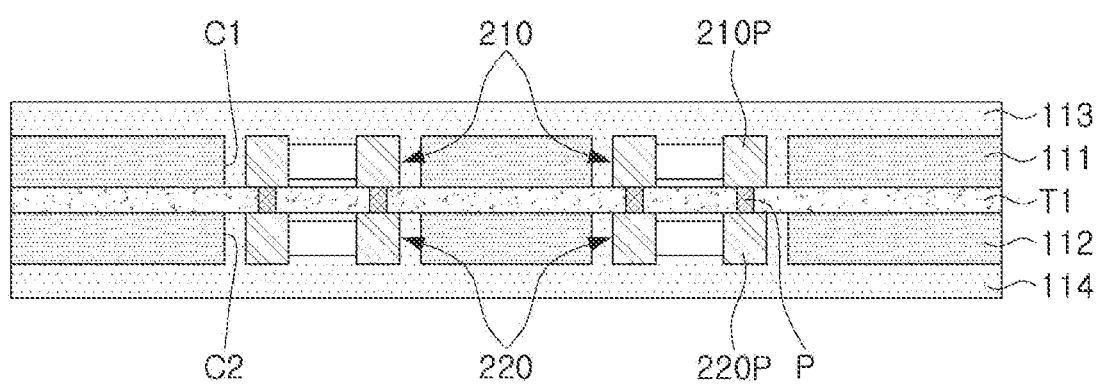

Referring to FIG. 8, the first and second carriers 710 and 720 may be peeled off, and referring to FIG. 9, the third and fourth insulating layers 113 and 114 may be disposed in the positions from which the first and second carriers 710 and 720 were peeled off. The third insulating layer 113 may fill at least a portion of the first cavity C1 and cover at least a portion of the first electronic component 210, and the fourth insulating layer 114 may fill at least a portion of the second cavity C2 and cover at least a portion of the second electronic component 220.

If necessary, a heating process may be additionally performed in order to increase fluidity of the third and fourth insulating layers 113 and 114 during the stacking process. After stacking, uncured or semi-cured materials may be cured by heating or the like.

Figure 10:
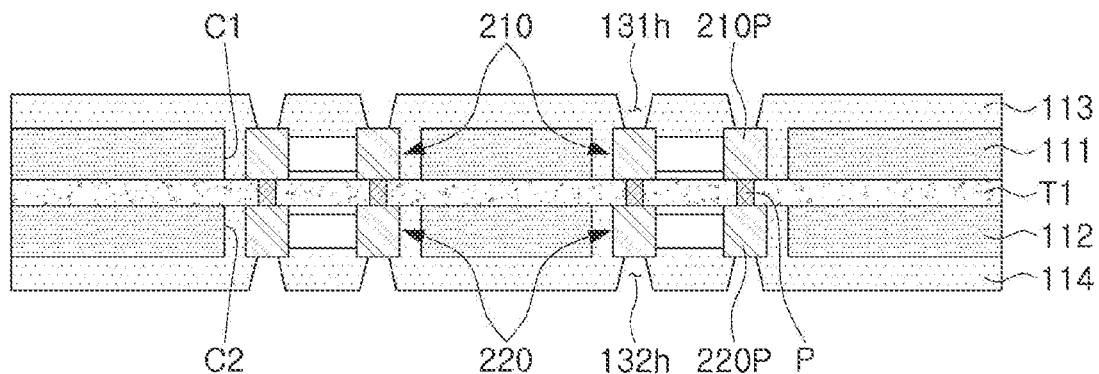
Figure 11:
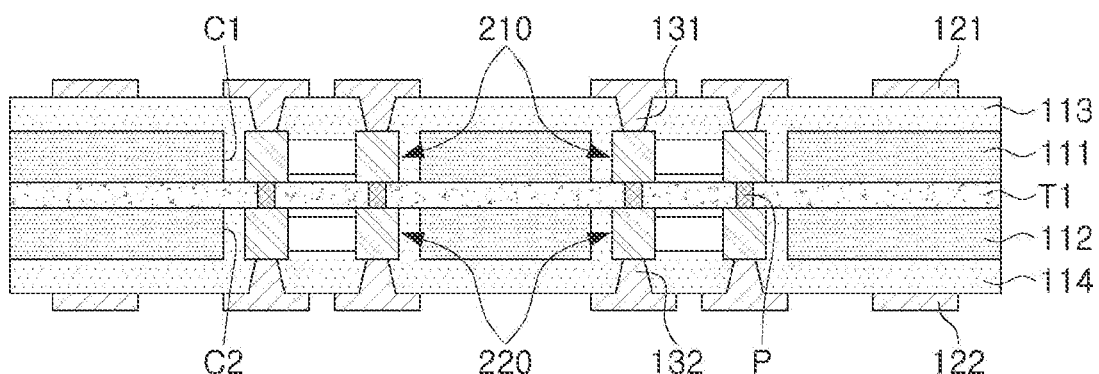

Referring to FIG. 10, first and second via holes 131h and 132h may be formed in the third and fourth insulating layers 113 and 114 of a stack by laser machining. Thereafter, as shown in FIG. 11, the first and second via holes 131h and 132h are plated by a plating process, so that the first and second via layers 131 and 132 may be disposed, and after the plating, the first and second interconnection layers 121 and 122 may be disposed through a patterning process.

Figure 12:
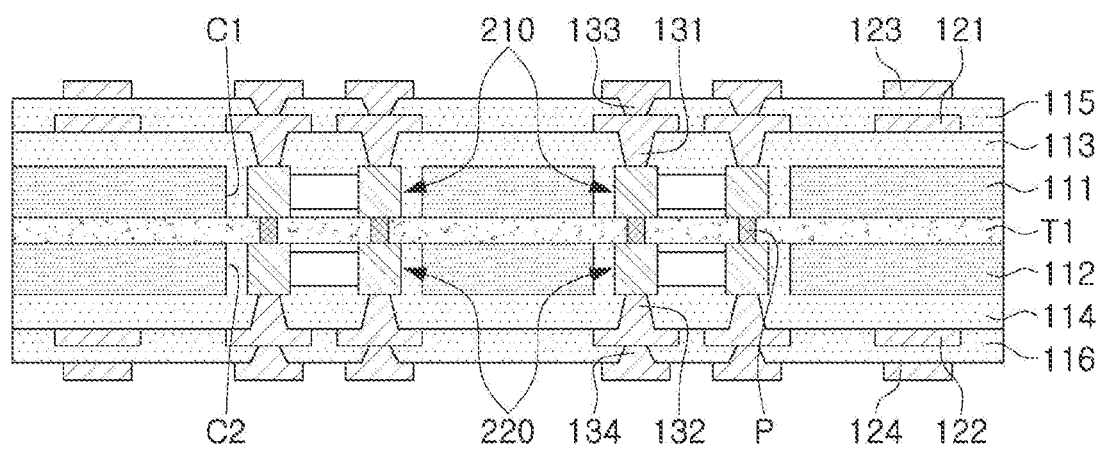

Referring to FIG. 12, the fifth and sixth insulating layers 115 and 116 are additionally stacked, and the third and fourth interconnection layers 123 and 124 and the third and fourth via layers 133 and 134 may be disposed through laser machining, plating, and patterning process. Thereafter, if necessary, the first and second passivation layers 141 and 142 are further formed. The substrate 100A having an electronic component embedded therein according to the example described above may be manufactured through a series of processes, and other redundant contents are omitted.

Figure 13:
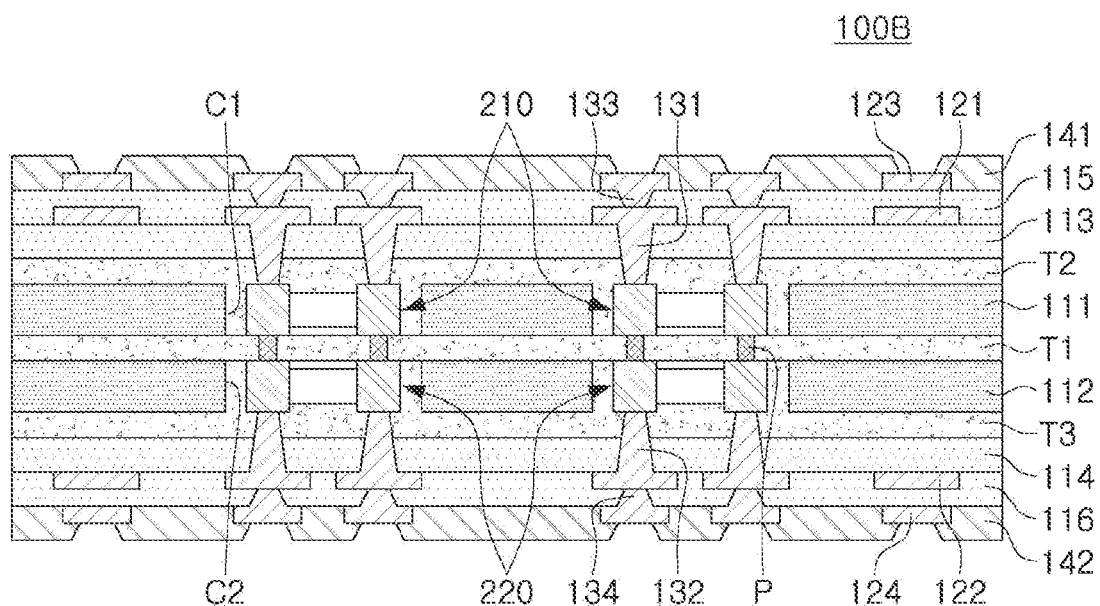
FIG. 13 is a cross-sectional view schematically illustrating another example of a substrate having an electronic component embedded therein.

FIG. 13 is a cross-sectional view schematically illustrating another example of a substrate having an electronic component embedded therein.

Referring to FIG. 13, compared to the substrate 100A having an electronic component embedded therein according to the example described above, in a substrate 100B having an electronic component embedded therein according to another example, second and third adhesive layers T2 and T3 are additionally disposed on the first and second insulating layers 111 and 112. Thereby, non-filling failures of the first and second cavities C1 and C2 may be effectively prevented.

Specifically, the substrate 100B having an electronic component embedded therein according to another example includes first and second insulating layers 111 and 112 having first and second cavities C1 and C2, a first adhesive layer T1 disposed between the first and second insulating layers 111 and 112, first and second electronic components 210 and 220 disposed in the first and second cavities C1 and C2, a second adhesive layer T2 disposed on the first insulating layer 111, a third adhesive layer T3 disposed on the second insulating layer 112, a third insulating layer 113 disposed on the second adhesive layer T2, a fourth insulating layer 114 disposed on the third adhesive layer T3, a first via layer 131 penetrating through at least a portion of each of the second adhesive layer T2 and the third insulating layer 113, and a second via layer 132 penetrating through at least a portion of each of the third adhesive layer T3 and the fourth insulating layer 114.

For example, the substrate 100B having an electronic component embedded therein according to another example may be manufactured by arranging the first and second electronic components 210 and 220 and subsequently disposing the second and third adhesive layers T2 and T3 on the first and second insulating layers 111 and 112, respectively, as in a process to be described below. Accordingly, the second and third adhesive layers T2 and T3 may be respectively disposed in at least portions of the first and second cavities C1 and C2, respectively. The second and third adhesive layers T2 and T3, which are insulators, may include the same material as that of the first adhesive layer T1 described above, may prevent a defect in which the first and second cavities C1 and C2 are not completely filled, and may effectively protect the first and second electronic components 210 and 220.

After the first and second electronic components 210 and 220 are disposed, second and third adhesive layers T2 and T3 that are insulating materials are disposed on the first and second insulating layers 111 and 112, respectively, and thus, the first and second via layers 131 and 132 connecting the first and second interconnection layers 121 and 122 to the first and second electronic components 210 and 220 may penetrate through the adhesive layers T2 and T3, respectively. For example, the first via layer 131 may penetrate through at least a portion of the second adhesive layer T2, and the second via layer 132 may penetrate through at least a portion of the third adhesive layer T3.

The second and third adhesive layers T2 and T3, which may include a bonding sheet, may more effectively fill the first and second cavities C1 and C2 due to material properties thereof. When the second and third adhesive layers T2 and T3 include a bonding sheet, the second and third adhesive layers T2 and T3 may be laminated with the first and second insulating layers 111 and 112, respectively, in an environment of higher temperature and higher pressure than in the case of laminating an ABF layer due to the characteristics of the bonding sheet having a higher melting point than the ABF. Accordingly, the second and third adhesive layers T2 and T3 disposed in a high-temperature/high-pressure environment may more completely fill the first and second cavities C1 and C2 and effectively prevent non-filling defects in advance.

Other contents are substantially the same as those described above, and thus, redundant contents are omitted.

FIGS. 14 to 17 are cross-sectional views schematically illustrating an example of manufacturing the substrate having an electronic component embedded therein of FIG. 13.

Figure 14:
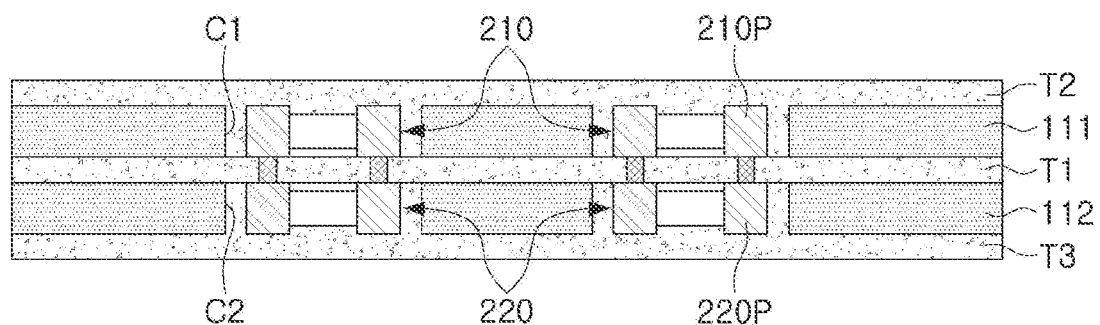
FIGS. 14 to 17 are cross-sectional views schematically illustrating an example of manufacturing a substrate having an electronic component embedded therein of FIG. 13.

Referring to FIG. 14, the manufacturing process of FIGS. 4 to 8 for the substrate 100A having an electronic component embedded therein according to an example may be equally applied. Thereafter, as shown in FIG. 14, the second and third adhesive layers T2 and T3 may be disposed on the first and second insulating layers 111 and 112, respectively, to fill at least portions of the first and second cavities C1 and C2.

Figure 15:
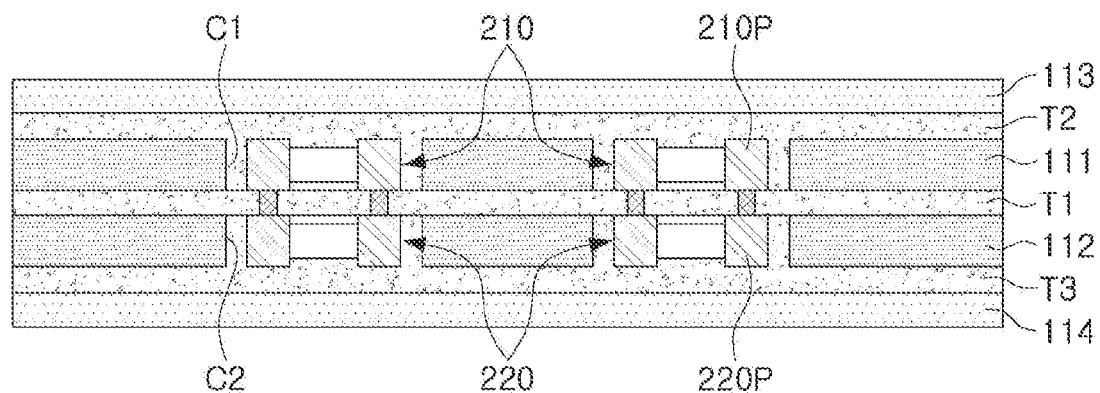

Referring to FIG. 15, the third insulating layer 113 may be disposed on the second adhesive layer T2, and the fourth insulating layer 114 may be disposed on the third adhesive layer T3.

Figure 16:
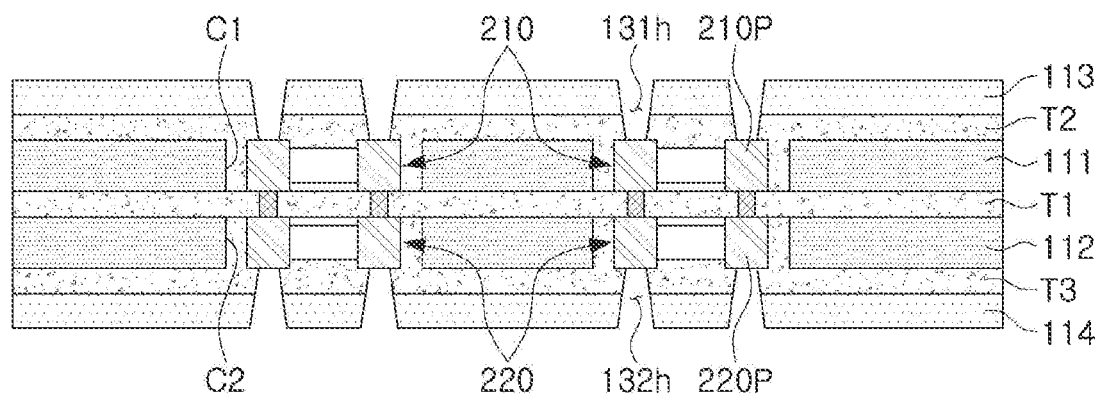

Referring to FIG. 16, first and second via holes 131h and 132h may be formed using a laser or mechanical drilling process. Specifically, the first via hole 131h may penetrate through at least a portion of each of the third insulating layer 113 and the second adhesive layer T2 and expose at least a portion of the electrode 210P of the first electronic component 210. In addition, the second via hole 132h may penetrate at least a portion of each of the fourth insulating layer 114 and the third adhesive layer T3 and expose at least a portion of the electrode 220P of the second electronic component 220.

Figure 17:
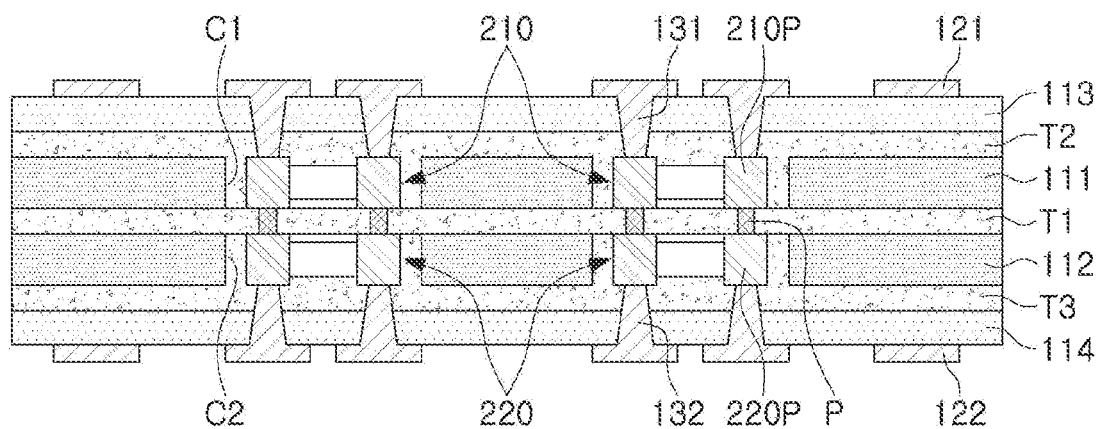

Referring to FIG. 17, the first and second interconnection layers 121 and 122 may be disposed on one surfaces of the third and fourth insulating layers 113 and 114, respectively, through plating and patterning processes. Also, first and second via layers 131 and 132 may be formed. Thereafter, the substrate 100B having an electronic component embedded therein according to another example of FIG. 13 may be completed through an additional build-up process.

As set forth above, as one of the various effects of the present disclosure, a substrate having an electronic component embedded therein advantageous for thinning may be provided.

As another of various effects of the present disclosure, a substrate having an electronic component embedded therein advantageous for reducing a size of the substrate may be provided.

As another of various effects of the present disclosure, a substrate having an electronic component embedded therein, having increased signal transmission efficiency by shortening a connection distance between a plurality of passive components, may be provided.

As another of various effects of the present disclosure, a substrate having an electronic component embedded therein capable of simplifying a process due to batch stacking and reducing manufacturing costs may be provided.

In the example embodiments, the terms "side region," "side surface," and the like, may be used to refer to a surface formed taken in right/left directions, the terms "lower side," "lower portion," "lower surface," and the like, may be used to refer to directions facing downwardly with reference to a cross-section in the diagrams for ease of description, and the terms "upper side," "upper portion," "upper surfaces," and the like, may be used to refer to directions opposing the above directions. The notion that an element is disposed on a side region, an upper side, an upper region, or a lower resin may include the configuration in which the element is directly in contact with an element configured as a reference in respective directions, and the configuration in which the element is not directly in contact with the reference element. The terms may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

The terms used in the example embodiments are used to simply describe an example embodiment, and are not intended to limit the present disclosure. A singular term includes a plural form unless otherwise indicated.

While example exemplary embodiments have been shown and described above, it will be apparent to those skilled in the art that modifications and variations could be made without departing from the scope of the present disclosure as defined by the appended claims.

What is claimed is:

1. A substrate comprising:
   first and second insulating layers including first and second cavities, respectively;
   first and second electronic components disposed within the first and second cavities, respectively;
   a first adhesive layer disposed between the first and second insulating layers;
   a connection member penetrating through at least a portion of the first adhesive layer;
   third and fourth insulating layers disposed on the first and second insulating layers and disposed in at least portions of the first and second cavities, respectively;
   first and second interconnection layers respectively disposed on the third and fourth insulating layers; and
   first and second via layers penetrating through at least portions of the third and fourth insulating layers,
   wherein the first via layer connects the first interconnection layer to the first electronic component,
   wherein the second via layer connects the second interconnection layer to the second electronic component,
   wherein an inclination of a sidewall of each of the first and second via layers with respect to a stacking direction on a cross-section is greater than an inclination of a sidewall of the connection member with respect to the stacking direction on the cross-section, and
   wherein one end and the other end of the connection member are connected to the first and second electronic components, respectively.

2. The substrate of claim 1, wherein the first and second electronic components include electrodes, respectively, and one end and the other end of the connection member are in contact with and connected to the electrodes of the first and second electronic components, respectively.

3. The substrate of claim 1, wherein one surface of the first adhesive layer is in contact with the first electronic component and the other surface of the first adhesive layer is in contact with the second electronic component.

4. The substrate of claim 1, wherein the connection member includes a conductive paste, and the first and second via layers include a plating layer.

5. The substrate of claim 1, wherein the connection member includes a material different from the first and second via layers.

6. The substrate of claim 1, wherein
   a cross-sectional area of one surface of each of the first and second via layers is greater than a cross-sectional area of the other surface thereof, and
   a cross-sectional area of one surface of the connection member is substantially the same as a cross-sectional area of the other surface thereof.

7. The substrate of claim 1, wherein the first and second via layers have a shape tapered in mutually opposite directions.

8. A substrate comprising:
   first and second insulating layers including first and second cavities, respectively;
   first and second electronic components disposed within the first and second cavities, respectively;
   a first adhesive layer disposed between the first and second insulating layers;
   a connection member penetrating through at least a portion of the first adhesive layer;
   second and third adhesive layers disposed on the first and second insulating layers and disposed in at least portions of the first and second cavities, respectively;
   third and fourth insulating layers respectively disposed on the second and third adhesive layers;
   first and second interconnection layers respectively disposed on the third and fourth insulating layers;
   a first via layer penetrating through at least a portion of each of the second adhesive layer and the third insulating layer; and
   a second via layer penetrating through at least a portion of each of the third adhesive layer and the fourth insulating layer,
   wherein the first via layer connects the first interconnection layer to the first electronic component,
   wherein the second via layer connects the second interconnection layer to the second electronic component,
   wherein an inclination of a sidewall of each of the first and second via layers with respect to a stacking direction on a cross-section is greater than an inclination of a sidewall of the connection member with respect to the stacking direction on the cross-section, and wherein one surface of the first adhesive layer is in contact with the first electronic component and the other surface of the first adhesive layer is in contact with the second electronic component.

9. The substrate of claim 8, wherein one end and the other end of the connection member are in contact with and connected to the first and second electronic components, respectively.

10. The substrate of claim 8, wherein the second or third adhesive layer includes the same material as that of the first adhesive layer.

11. The substrate of claim 8, wherein the first and second electronic components at least partially overlap each other in a stacking direction of the first and second insulating layers and the first adhesive layer.

* * * * *